United States Patent
Kim

(10) Patent No.: US 8,174,894 B2
(45) Date of Patent: May 8, 2012

(54) PROGRAM METHOD OF FLASH MEMORY DEVICE

(75) Inventor: Ju In Kim, Incheon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 137 days.

(21) Appl. No.: 12/493,317

(22) Filed: Jun. 29, 2009

(65) Prior Publication Data

US 2010/0027348 A1  Feb. 4, 2010

(30) Foreign Application Priority Data

Aug. 1, 2008  (KR) .................. 10-2008-0075721

(51) Int. Cl.
*G11C 11/34* (2006.01)

(52) U.S. Cl. .......... 365/185.19; 365/185.18; 365/185.22

(58) Field of Classification Search ............. 365/185.19, 365/185.18, 185.22, 185.14, 185.03, 230.04, 365/185.11, 189.05, 185.21, 185.17, 185.28

See application file for complete search history.

(56) References Cited

U.S. PATENT DOCUMENTS

| 7,196,932 B2* | 3/2007 | Takeuchi et al. | 365/185.21 |
| 7,869,273 B2* | 1/2011 | Lee et al. | 365/185.02 |
| 2008/0094901 A1* | 4/2008 | Park et al. | 365/185.12 |
| 2008/0239822 A1* | 10/2008 | Kosaki et al. | 365/185.17 |
| 2009/0040831 A1* | 2/2009 | Noh et al. | 365/185.19 |

FOREIGN PATENT DOCUMENTS

KR  100769802 B1  10/2007

OTHER PUBLICATIONS

Notice of Allowance issued from Korean Intellectual Property Office on Sep. 9, 2011.

* cited by examiner

*Primary Examiner* — Dang Nguyen
(74) *Attorney, Agent, or Firm* — IP & T Group LLP

(57) ABSTRACT

A program method of a flash memory device includes inputting a first data and a second data to a page buffer coupled to memory cells including an even page and an odd page, pre-programming a first memory cell of the odd page using the first data, programming a second memory cell of the even page using the second data, and programming the pre-programmed first memory cell using the first data.

8 Claims, 5 Drawing Sheets

PROGRAM METHOD OF FLASH MEMORY DEVICE

CROSS-REFERENCES TO RELATED APPLICATIONS

Priority to Korean patent application number 10-2008-0075721 filed on Aug. 1, 2008, the entire disclosure of which is incorporated by reference herein, is claimed.

BACKGROUND

An embodiment relates to a program method of a flash memory device and, more particularly, to a program method of a flash memory device, which is capable of reducing the irregularity of a threshold voltage resulting from the interference effect of a flash memory device having multi-level cells.

In recent years, there is an increasing demand for nonvolatile memory devices which can be electrically programmed and erased and do not require the refresh function of rewriting data at specific intervals. In order to develop large capacity memory devices capable of storing a large amount of data, research is being carried out on technologies for the high integration of memory devices. Accordingly, active research is being carried out on a flash memory.

A flash memory is mainly divided into a NAND flash memory and a NOR flash memory. The NOR flash memory has an excellent random access time characteristic because of its structure in which memory cells are respectively connected to bit lines and word lines. The NAND flash memory is excellent in terms of having high integration level because of its structure in which memory cells are connected in series, thereby requiring only one contact per cell string. Accordingly, the NAND structure is for the most part used in a high-integrated flash memory.

Recently, in order to further increase the integration of a flash memory, active research is being carried out on a multi-bit cell which is capable of storing plural data in one memory cell. This type of a memory cell is generally called a multi-level cell (MLC). A memory cell capable of storing a single bit is called a single level cell (SLC).

The MLC is generally configured to have two or more threshold voltage distributions and is capable of storing two or more data corresponding to the respective threshold voltage distributions. Accordingly, since one cell of the MLC can be divided into four or more levels as compared with the SLC having two levels, the bit number of the MLC can be two or more times the bit number of the SLC.

In order to embody this MLC, it is important to reduce a shift in the threshold voltage of a cell. One of the factors to change the threshold voltage of a cell is an interference effect resulting from capacitance between cells.

FIG. 1 is a diagram showing the distributions of a threshold voltage for illustrating a known program method of a flash memory device.

The memory cell array of a flash memory device generally has a string structure in which memory cells are respectively connected in series to even bit lines and odd bit lines. The even and odd bit lines adjoin to each other.

During the program operation of the flash memory device, a program voltage (for example, 15 V) is first applied to the word line of a first memory cell coupled to the even bit line, so the first memory cell is programmed with a threshold voltage distribution indicated by A.

Next, a program voltage (for example, 15 V) is applied to the word line of a second memory cell coupled to an odd bit line adjacent to the first memory cell, so the second memory cell is programmed with a threshold voltage distribution indicated by A'. In this case, the threshold voltage distribution of the first memory cell may move from A to B because of an interference effect during the program operation of the second memory cell.

The shift in the threshold voltage deteriorates the program characteristic of a flash memory device. In particular, in the case of a flash memory device having a multi-level cell, sensing margin may be reduced because of a shift in the threshold voltage.

BRIEF SUMMARY

An exemplary embodiment is directed towards a program operation of a flash memory device, in which a threshold voltage is raised by a certain level by pre-programming the odd page of memory cells including an even page and the odd page, and an even page program operation and an odd page program operation are subsequently performed, so that an irregular distribution of the threshold voltage resulting from an inter-cell interference effect may be prevented.

In an exemplary aspect, a program method of a flash memory device includes inputting a first data and a second data to a page buffer coupled to memory cells including an even page and an odd page, pre-programming a first memory cell of the odd page using the first data, programming a second memory cell of the even page using the second data, and programming the pre-programmed first memory cell using the first data.

A verification of the pre-program is performed using a first verification voltage which is lower than a target verification voltage.

A program verification is performed using the target verification voltage after the first memory cell and the second memory cell are programmed.

A threshold voltage of the first memory cell after the pre-program has been risen in response to an interference effect of the program operation of the second memory cell.

The program of the first memory cell and the program of the second memory cell are performed using an incremental step pulse programming (ISPP) method.

DESCRIPTION OF SPECIFIC EMBODIMENT

Hereinafter, the present disclosure will be described in detail in connection with an embodiment with reference to the accompanying drawings. The figures are provided to allow those having ordinary skill in the art to understand the scope of embodiments of the invention.

FIGS. 2 to 5 are diagrams illustrating a program method of a flash memory device according to an embodiment. A program method of a flash memory device according to an embodiment is described below with reference to FIGS. 2 to 5.

1) Input Program Data (11)

Figure 1:
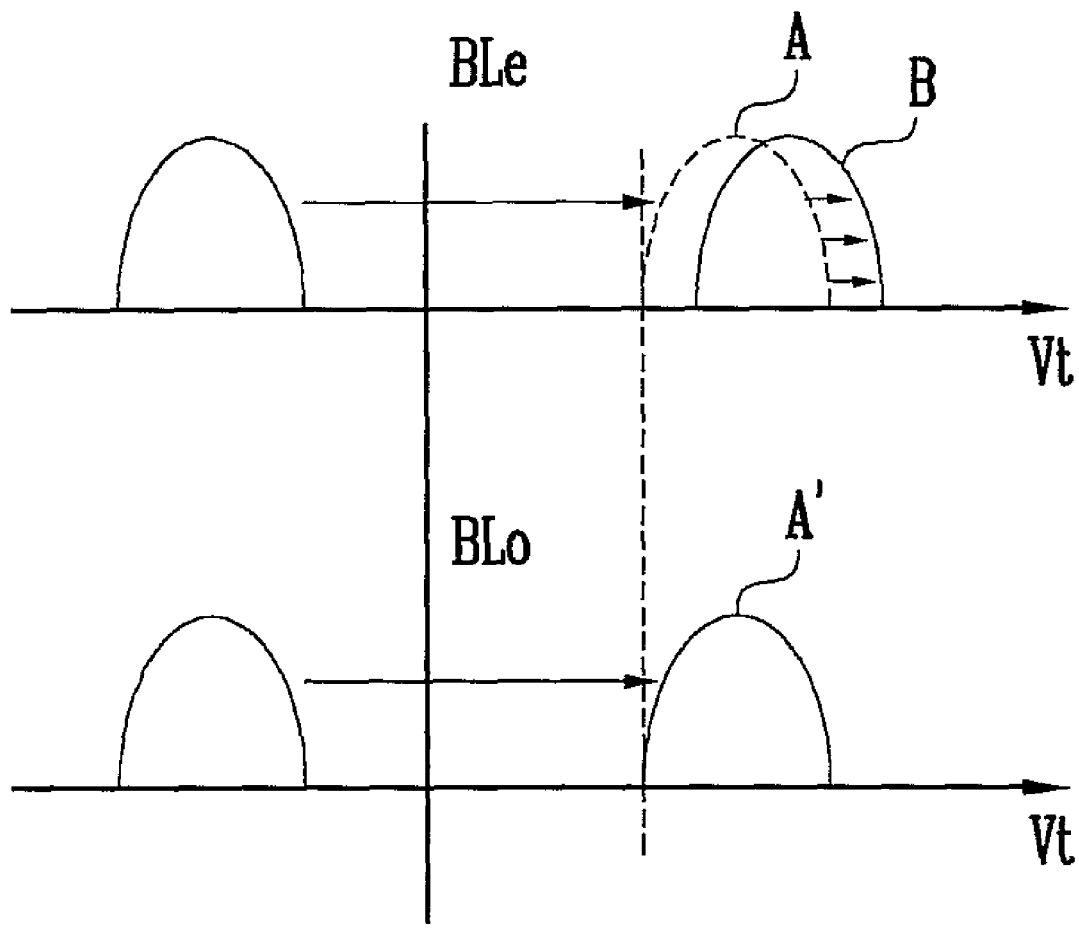
FIG. 1 is a diagram showing the distributions of a threshold voltage for illustrating a known program method of a flash memory device.
Figure 2:
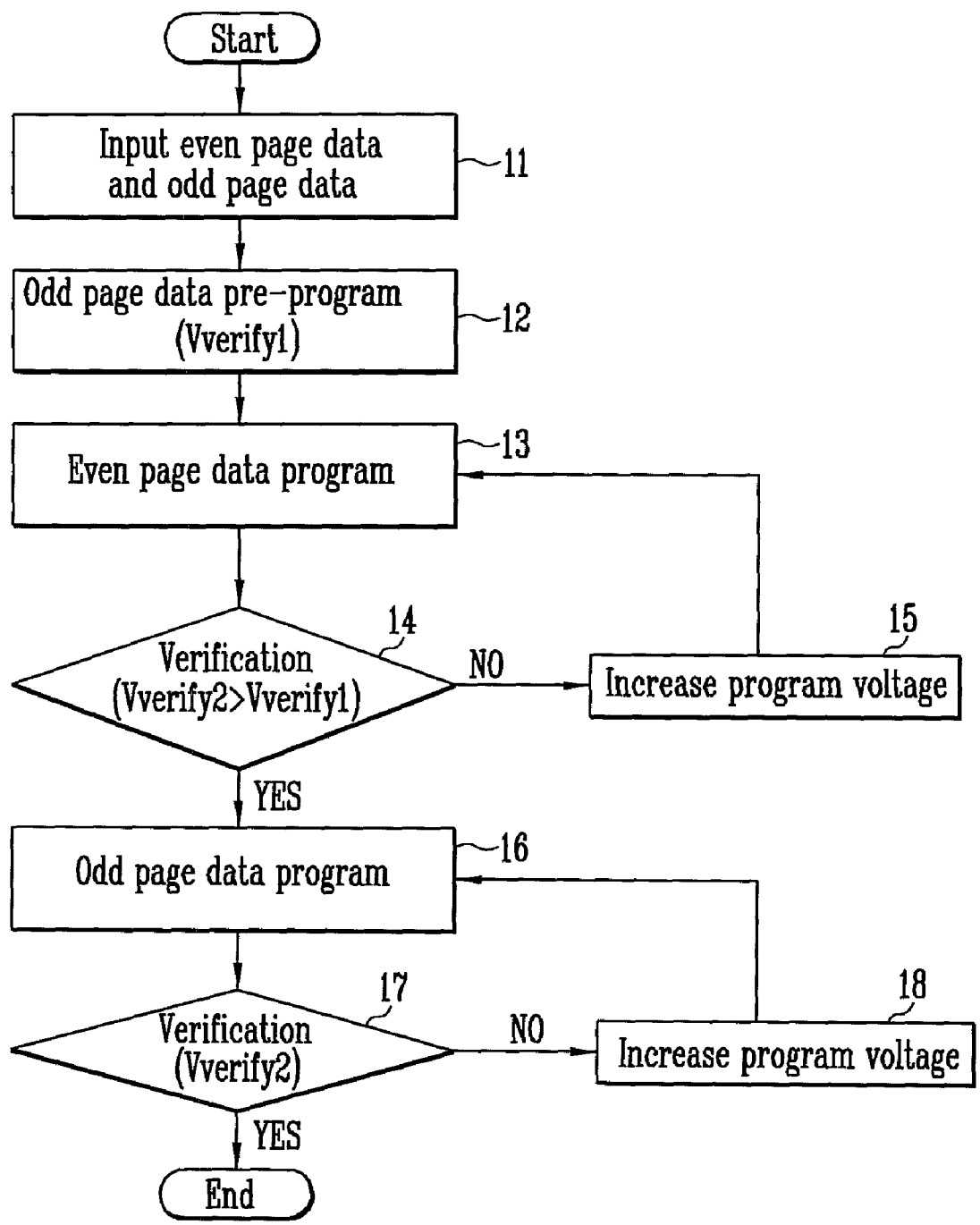
FIG. 2 is a flowchart illustrating a program method of a flash memory device according to an embodiment.
Figure 3:
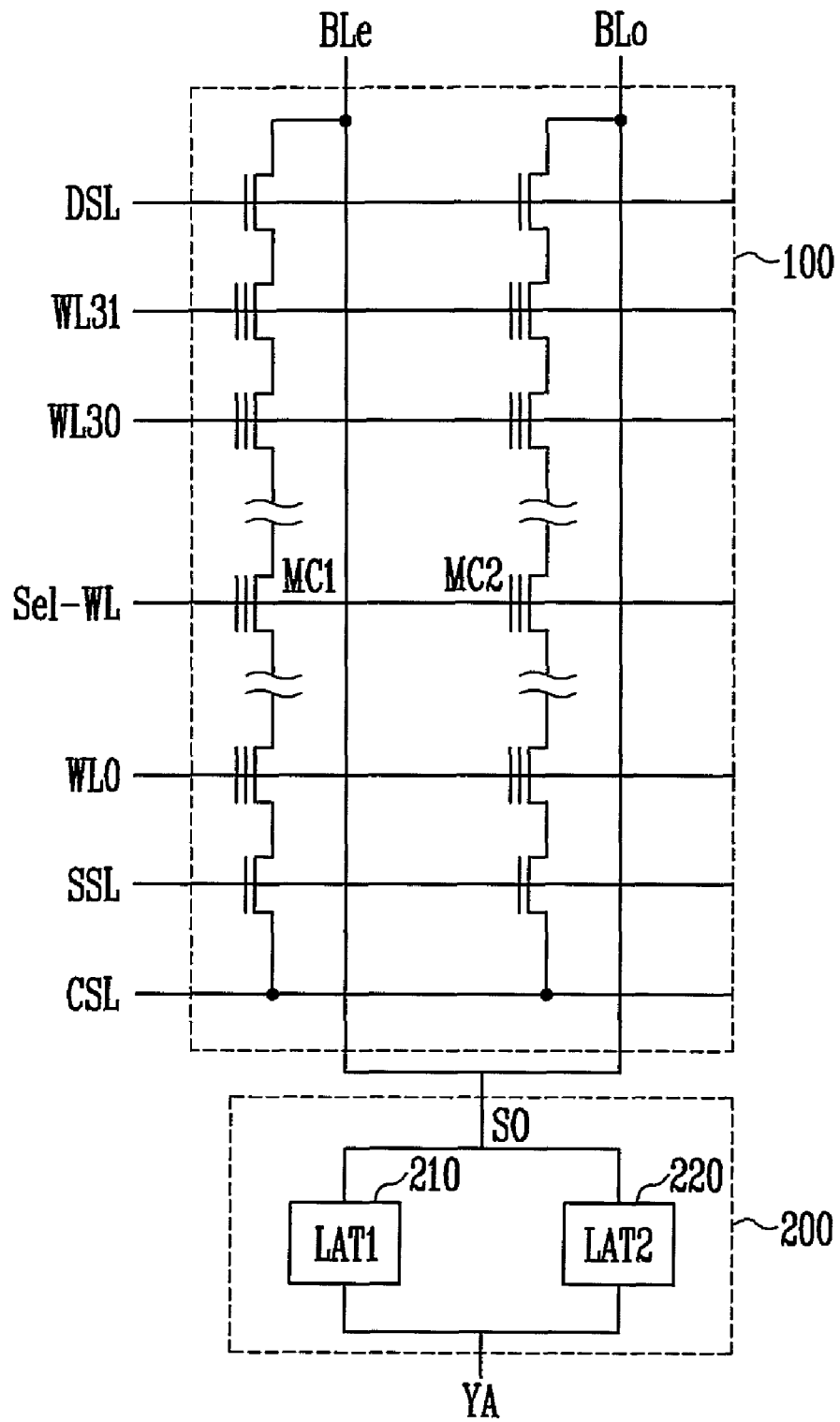
FIG. 3 is a circuit diagram of a flash memory device according to an embodiment.

FIG. 2 is a flowchart illustrating a program method of a flash memory device according to an embodiment, and FIG. 3 is a circuit diagram of a flash memory device according to an embodiment.

Program data (i.e., even page data to be stored in the memory cell MC1 of an even page and odd page data to be stored in the memory cell MC2 of an odd page) are input to a page buffer 200 coupled to memory cells 100 including the even page and the odd page. The page buffer 200 includes first and second latches 210 and 220 and stores the even page data and the odd page data in the first and second latches 210 and 220.

2) Odd Page Data Pre-Program (12)

Figure 4:
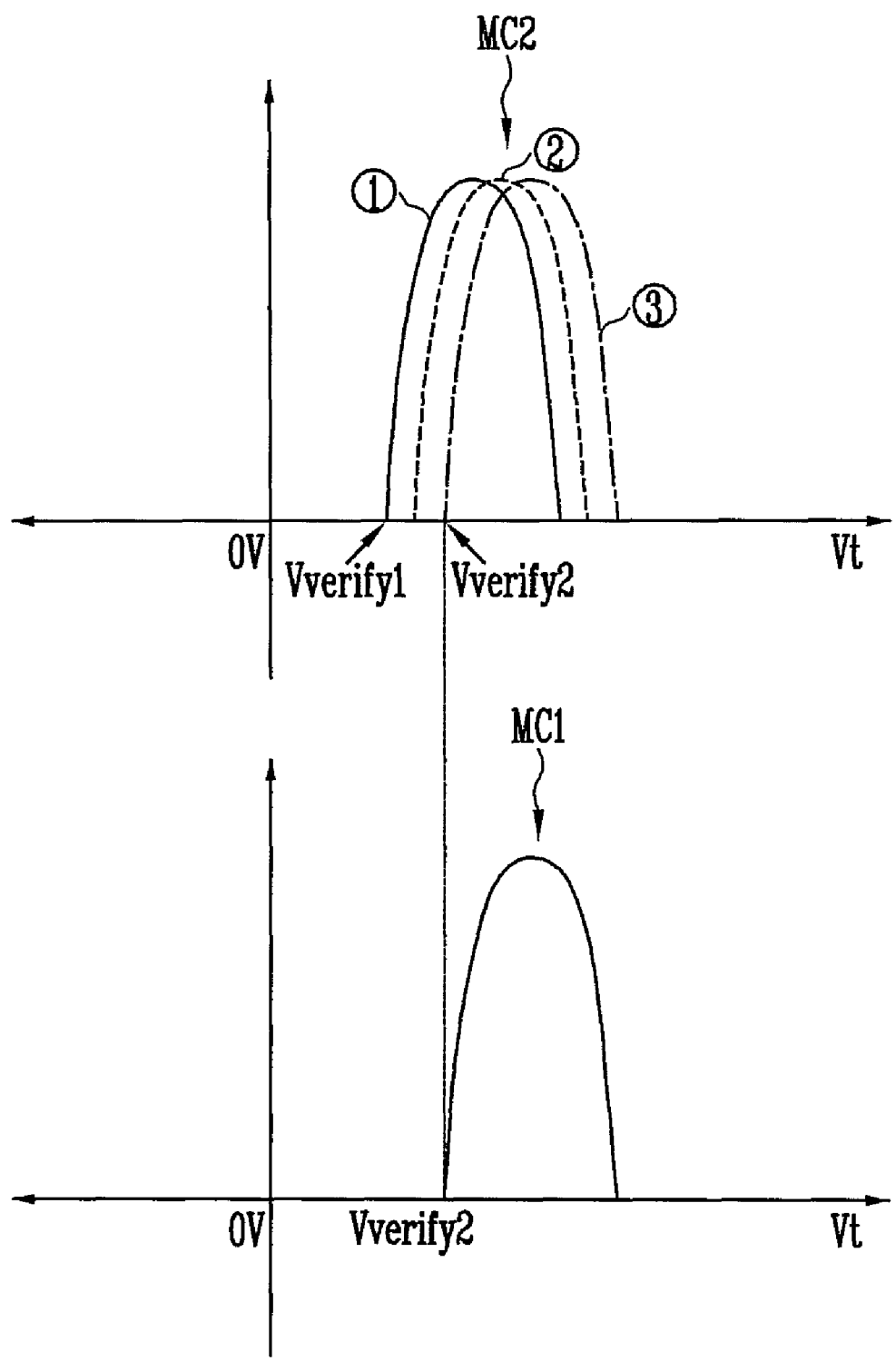
FIG. 4 is a diagram showing the distributions of the threshold voltage of memory cells of the flash memory device according to an embodiment.

FIG. 4 is a diagram showing the distributions of the threshold voltage of memory cells of the flash memory device according to an embodiment.

The odd page data temporarily stored in the page buffer 200 is transferred through an odd bit line BLo, and a pre-program voltage is applied to a word line Sel-WL coupled to the memory cell MC2 of the odd page, thereby pre-programming the memory cell MC2 of the odd page. Accordingly, the memory cell MC2 of the odd page has a distribution of threshold voltage Vt indicated by 1 of FIG. 4. Here, the pre-program may be performed using a first verification voltage Vverify1 so that the lowest threshold voltage is greater than the first verification voltage Vverify1.

The first verification voltage Vverify1 may be lower than a target verification voltage (a second verification voltage Vverify2) which is used in an actual verification operation (a verification operation 17 to be describer later). In more detail, a shift in the distribution of a threshold voltage according to an interference effect between the even and odd bit lines is measured, and the first verification voltage Vverify1 is set to be lower than the second verification voltage Vverify2 with the measured shift taken into consideration.

3) Even Page Data Program (13)

The even page data temporarily stored in the page buffer 200 is transferred through an even bit line BLe, and a first program voltage PV1 is applied to the word line Sel-WL coupled to the memory cell MC1 of the even page, thereby programming the memory cell MC1 of the even page.

4) Verification Operation (14)

It is determined whether the program operation has been normally performed by applying the second verification voltage Vverify2 to the memory cell MC1 of the even page on which the above-described even page data program (13) has been completed. In other words, it is determined whether a threshold voltage of the memory cell MC1 of the even page is more than or less than the second verification voltage Vverify2. If, as a result of the determination, the threshold voltage of the memory cell MC1 of the even page is determined to be more than the second verification voltage Vverify2, the program operation is determined to have been completed. However, if, as a result of the determination, the threshold voltage of the memory cell MC1 of the even page is determined to be less than the second verification voltage Vverify2, the program operation is determined not to have been completed. In this case, the second verification voltage Vverify2 may be equal to a target threshold voltage of a general program operation and may be more than the first verification voltage Vverify1 used in the odd page data pre-program operation (12).

5) Increase Program Voltage (15)

Figure 5:
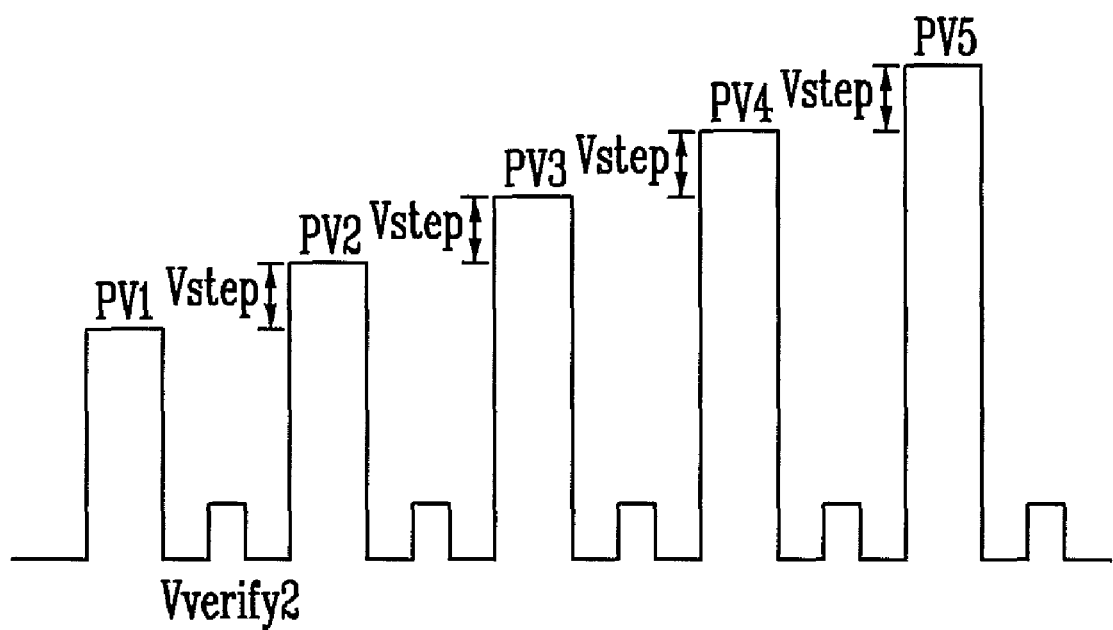
FIG. 5 is a waveform showing program voltages for illustrating an ISPP program method according to an embodiment.

FIG. 5 is a waveform showing program voltages for illustrating an ISPP program method according to an embodiment.

If, as a result of the determination of the verification operation (14), the threshold voltage of the memory cell MC1 of the even page is determined to be less than the second verification voltage Vverify2, the even page data program operation (13) is performed again, but a second program voltage PV2 which is equal to the first program voltage PV1 raised by a step voltage Vstep is used. That is, the re-program operation is performed using an incremental step pulse programming (ISPP) method.

At this time, the distribution of the threshold voltage of the memory cell MC2 of a neighboring odd page moves from 1 to 2 owing to an interference effect occurring during the program operation.

6) Odd Page Data Program (16)

The memory cell MC2 of the odd page is programmed by applying the first program voltage PV1 to the word line Sel-WL coupled to the memory cell MC2 of the odd page on which the above odd page data pre-program operation (12) has been completed.

7) Verification Operation (17)

It is determined whether the program operation has been normally performed by applying the second verification voltage Vverify2 to the memory cell MC2 of the odd page. That is, it is determined whether a threshold voltage of the memory cell MC2 of the odd page is more than or less than the second verification voltage Vverify2. If, as a result of the determination, the threshold voltage of the memory cell MC2 of the odd page is more than the second verification voltage Vverify2, the program operation is determined to have been completed. If, as a result of the determination, the threshold voltage of the memory cell MC2 of the odd page is less than the second verification voltage Vverify2, the program operation is determined not to have been completed.

8) Increase Program Voltage (18)

If, as a result of the determination of the verification operation (17), the threshold voltage of the memory cell MC2 of the odd page is less than the second verification voltage Vverify2, the odd page data program operation (16) is performed again, but the second program voltage PV2 in which the first program voltage PV1 is raised by the step voltage Vstep is used. That is, the re-program operation is performed using an ISPP method.

Accordingly, the distribution of the threshold voltage of the memory cell MC2 of the odd page moves from 2 to 3 as shown in FIG. 4.

Consequently, the memory cell MC1 of the even page and the memory cell MC2 of the odd page have a uniform threshold voltage distribution.

According to the embodiment of this disclosure, a threshold voltage is raised by a certain level by pre-programming the odd page of memory cells including an even page and the odd page, and subsequently performing an even page program operation and an odd page program operation. Accordingly, an irregular distribution of the threshold voltage, resulting from an inter-cell interference effect, can be prevented.

What is claimed is:

1. A program method of a flash memory device, comprising:
inputting a first data and a second data to a first latch and a second latch, respectively, of a page buffer coupled to memory cells, wherein the memory cells include an even memory cell coupled to an even bit line and an odd memory cell coupled to an odd bit line;

pre-programming the odd memory cell by applying a pre-program voltage to a selected word line, wherein a threshold voltage of the pre-programmed odd memory cell is higher than a first verification voltage;

programming the even memory cell by applying a first program voltage to the selected word line after the pre-programming of the odd memory cell, wherein a threshold voltage of the programmed even memory cell is higher than a second verification voltage; and programming the odd memory cell that is in a pre-programmed state due to the pre-programming of the odd memory cell by applying the first program voltage to the selected word line after the programming of the even memory cell, wherein the threshold voltage of the programmed odd memory cell is higher than the second verification voltage, wherein the first verification voltage is lower than the second verification voltage.

2. The program method of claim 1 wherein a difference between the first verification voltage and the second verification voltage corresponds to a shift in a threshold voltage distribution due to an interference effect between the even memory cell and the odd memory cell.

3. The program method of claim 1, wherein the threshold voltage of the odd memory cell after the pre-program rises in response to an interference effect of the program of the even memory cell.

4. The program method of claim 1, wherein the pre-program of the odd memory cell is performed using an incremental step pulse programming (ISPP) method.

5. The program method of claim 1, wherein a threshold voltage distribution of the pre-programmed odd memory cell is smaller than that of the programmed even memory cell.

6. The program method of claim 1, wherein the program of the odd memory cell is performed using an incremental step pulse programming (ISPP) method.

7. The program method of claim 1, wherein the program of the even memory cell is performed using an incremental step pulse programming (ISPP) method.

8. The program method of claim 1, wherein the pre-programming of the odd memory cell includes pre-programming the odd memory cell selectively among the odd and even memory cells without pre-programming the even memory cell.

* * * * *